US005912472A

United States Patent [19]

Voigtlaender et al.

[11] Patent Number: 5,912,472

[45] Date of Patent: Jun. 15, 1999

[54] SWITCHABLE PLANAR HIGH FREQUENCY RESONATOR AND FILTER

[75] Inventors: Klaus Voigtlaender, Wangen; Claus Schmidt, Magstadt; Matthias Klauda; Christian Neumann, both of Stuttgart, all of Germany

[73] Assignee: Robert Bosch GmbH, Stuttgart, Germany

[21] Appl. No.: 08/856,840

[22] Filed: May 15, 1997

[30] Foreign Application Priority Data

May 15, 1996 [DE] Germany .......................... 196 19 585

[51] Int. Cl.[6] .................................................. H01L 29/06

[52] U.S. Cl. .............................. 257/31; 257/39; 501/190; 501/210; 333/219; 333/995

[58] Field of Search ................................ 257/31, 38, 39; 501/210, 190; 333/219, 995

[56] References Cited

U.S. PATENT DOCUMENTS

| | | | |
|---|---|---|---|
| 5,258,626 | 11/1993 | Suzuki et al. | 257/39 |
| 5,346,882 | 9/1994 | Muller | 505/190 |
| 5,721,195 | 2/1998 | Grothe et al. | 505/210 |

FOREIGN PATENT DOCUMENTS

| | | |
|---|---|---|
| 0 357 507 A2 | 3/1990 | European Pat. Off. . |
| 62-333426 | 12/1987 | Japan . |
| WO 93/00720 | 1/1993 | WIPO . |
| WO 94/28592 | 12/1994 | WIPO . |

OTHER PUBLICATIONS

"Planar UHF–Filter aus Supraleitern mit hoher Sprungtemperatur" By Dipl.–Ing Matthias Kuhn, Burgdorf–Berel, Reihe 9: Elektronik, Nr. 189, Fortschritt–Berichte VIL.

*Primary Examiner*—Sara Crane
*Attorney, Agent, or Firm*—Michael J. Striker

[57] ABSTRACT

A portion of the superconductor in a planar resonator made from that superconductor can be switched into the normally conducting state so that its effective lateral dimensions are changed. The special advantage of this planar resonator is that a switchable filter can be constructed very economically based on its planar resonator structure. Since no perturbing bodies are necessary in the field, the invention points the way to a switchable filter with reduced high frequency losses.

8 Claims, 3 Drawing Sheets

FIG. 2b
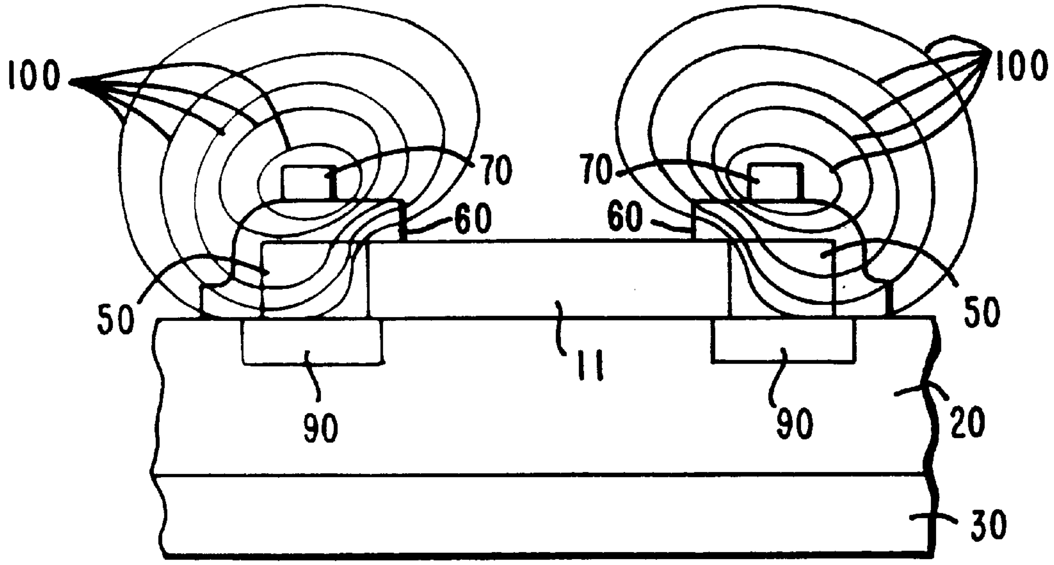
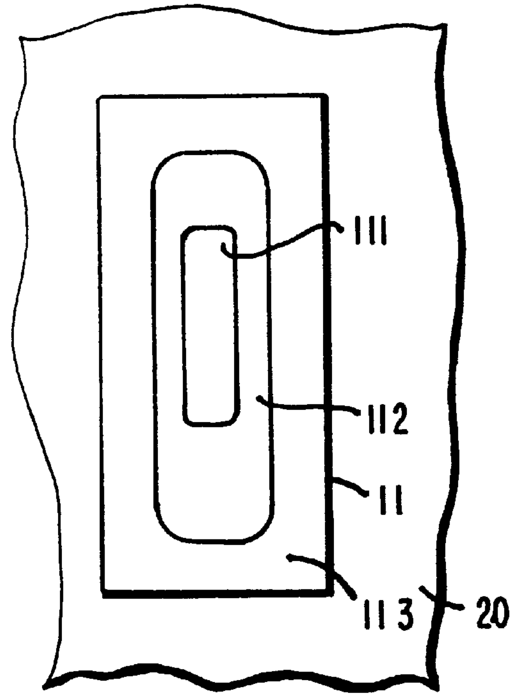
FIG. 3

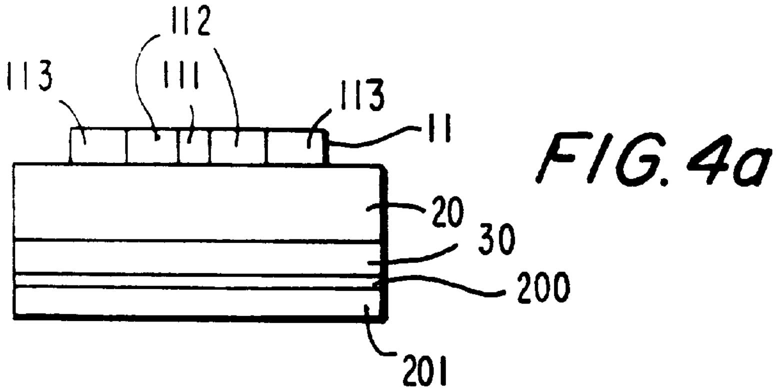
FIG. 4a
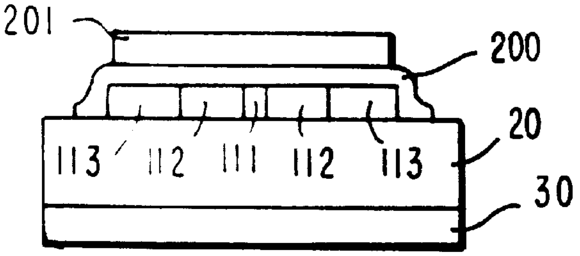
FIG. 4b
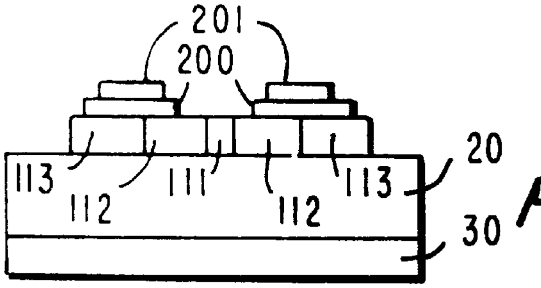
FIG. 4c
FIG. 5
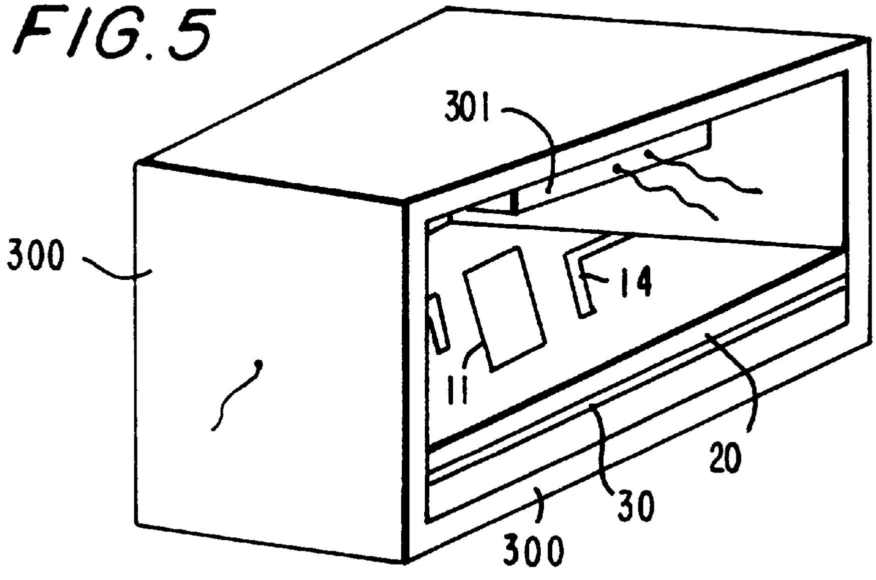

SWITCHABLE PLANAR HIGH FREQUENCY RESONATOR AND FILTER

BACKGROUND OF THE INVENTION

The present invention relates to a switchable planar high frequency resonator with a superconductor microstructure mounted on a substrate, whose geometry determines its resonance properties, especially the position and width of the resonance, and also relates to a high frequency filter based on it. A switchable high frequency resonator is already known from WO 93/00720. In this reference a resonator is described comprising a microstructure made from a high temperature superconductor on a substrate, over which a gallium arsenide platelet or lamina was glued. The conductivity of the gallium arsenide could be increased by several orders of magnitude by light irradiation. The effective dielectric function of the surroundings of the resonator can be changed which changes the resonance properties of the resonator. When the eigenfrequencies of the resonator are outside of the occurring high frequency spectrum or strongly damped, a filtration is avoided with this resonator.

A tunable bandpass filter is provided with microconductor strip construction methods as described in WO 94/28592. Several resonators made from a high temperature superconductor are mounted together with input and output leads on a complex many layer substrate. This many layer substrate includes a supporting material and a ferroelectric or anti-ferroelectric layer as well as several required buffer layers. An electric field is applied to the ferroelectric or anti-ferroelectric layer which changes the dielectric function of this ferroelectric or anti-ferroelectric layer so that the effective dielectric function of the surroundings is similar changed. By changing the real part of the effective dielectric function, the eigenfrequencies of all resonators in the filter are shifted approximately equally; a filter constructed using this resonator is thus tunable or, in cases in which the tuning region is selected sufficiently wide, also switchable.

An additional method of tuning resonators is described in VDI Research Report, Series 9, p 189 (1994). Perturbing bodies are inserted by mechanical positioning devices in the field over the resonator. A slight change of the effective dielectric function of the surroundings of the strip conductor is achieved by the position change of the perturbing bodies which have constant dielectric properties. This method is more frequently used for compensation or calibration of filter elements, than for dynamic adjustment or for switching.

SUMMARY OF THE INVENTION

It is an object of the present invention to provide an improved planar high frequency resonator and a high frequency filter based on it.

It is another object of the invention to provide a method of making the improved planar high frequency resonator.

These objects, and others which will be made more apparent hereinafter, are attained with a planar high frequency resonator with a superconductor microstructure mounted on a substrate, whose geometry determines its resonance properties, especially the position and width of the resonance.

According to the invention means are provided in the resonator for shifting a predetermined portion of the superconductor microstructure into the normal conducting state.

The resonator according to the invention has the advantage that it is optimizable to higher quality, since it is switchable without loss increasing perturbing bodies. It can be made advantageously with reduced structural expense and fewer process steps, which are completely compatible with standard microstructuring processes.

In preferred embodiments of the invention a cuprate can be used as the superconducting material, since with this material the relationship between the critical temperature and the oxygen stoichiometry is particularly simple.

Furthermore it is particularly advantageous to provide the resonator with Josephson contacts at an edge which are arranged perpendicularly to the high frequency current flow, since this switch is largely insensitive to cosmic radiation. As an additional advantage in a series circuit of several Josephson contacts an individual defective contact remains without consequence. This increases the reliability against breakdown in use and reduces the proportion thrown out during production.

It is particularly advantageous to make the Josephson contacts by means of a perturbation or disturbance written into the substrate. Only a single additional process step is necessary for this type of Josephson contact.

Besides it is especially advantageous to apply an electrical insulating layer and a conductor producing a magnetic field on the superconductor layer, since the insulating layer simultaneously can act as protective later for the superconductor.

Also in a particularly advantageous embodiment zones or regions with different critical temperatures are produced in the resonating structure because with their assistance the resonator can both be fine-tuned and also switched.

Moreover it is particularly advantageous to provide zones of different critical temperature in the resonator structure by providing crystallographic disorder in the superconductor film, since a plurality of different resonators can be provided with the help of a superconductor microstructure as starting material.

Finally it is especially advantageous to provide different critical temperatures in the superconductor microstructure by variation of the oxygen content in the superconductor film, since this method allows the controlling of the transition temperatures in the varying regions, and simultaneously the reduction of the high frequency losses.

BRIEF DESCRIPTION OF THE DRAWING

The objects, features and advantages of the invention will now be illustrated in more detail with the aid of the following description of the preferred embodiments, with reference to the accompanying figures in which:

FIG. 2*b* is a cutaway side view of the device shown in FIG. 2*a;*

FIG. 3 is a plan view of a resonator having zones of different critical temperature;

FIG. 4*a* is a cutaway side view of the device shown in FIG. 3 with an additionally mounted heating resistor;

FIG. 4*b* is a cutaway side view of the device shown in FIG. 3 with additional microstructure on the resonator for isothermalization and heating of the resonator;

FIG. 4*c* is a cutaway side view of the device shown in FIG. 3 with two additional microstructure for Peltier cooling and heating mounted on the resonator; and FIG. 5 is a perspective view of a filter mounted in a housing with temperature regulation.

DESCRIPTION OF THE PREFERRED EMBODIMENTS

Figure 1:
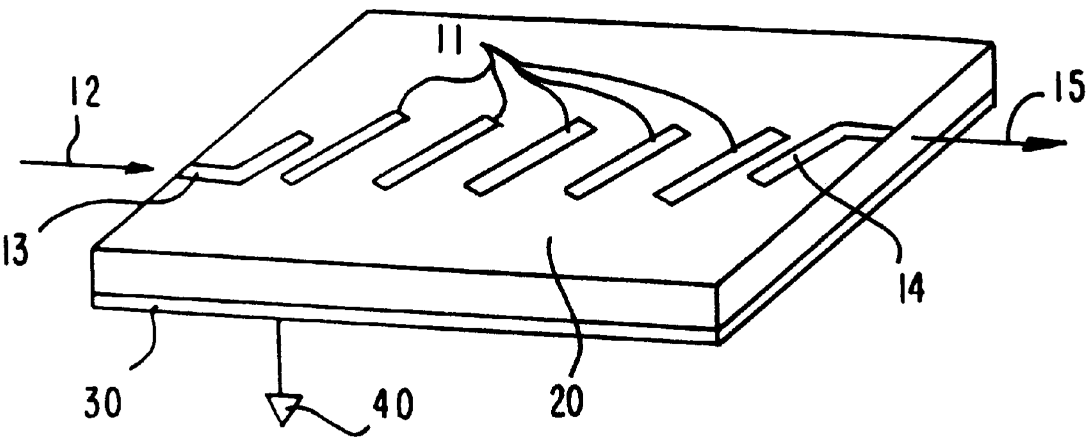
FIG. 1 is a planar bandpass filter in microstrip conductor engineering made from five resonators.

FIG. 1 shows a planar bandpass filter. A housing which is eventually provided is not shown to provide improved illustration. An unstructured thin layer of high temperature superconductor is located on the underside of the dielectric substrate 20, which functions as a ground conductor 30. Five rectangular superconducting microstructures which form the resonators 11 are arranged slanted or inclined and beside each other on the top or upper side of the substrate 20. A detailed view of these resonators 11 is shown in the following figures. A capacitively coupled input 13 and a capacitively coupled output 14 made from a high temperature superconductor are provided.

In order to guarantee epitaxial growth of the high temperature superconductor film from which the superconductor microstructures are made and in order to reduce the high frequency losses, it is advantageous to use a crystalline substrate 20. The thickness of the high temperature superconductor film is limited according to the state of the art to about 4000 Angstroms, however it is not critical for the application shown here.

Here the word "superconducting" is synonymous with "found in the superconducting state" which is characterized for one skilled in the art clearly by the Meissner effect and vanishing ohmic resistance. In contrast the word "superconductor" means a material which can be a superconductor with sufficient cooling, also when it is found in the normal conducting (non-superconducting) state.

An incoming microwave- or millimeter signal 12 is reflected by the resonator 11, in cases in which its frequency does not coincide with the resonance frequency of the resonator. In other cases it is transmitted whereby the largest portion of the wave propagation occurs in the dielectric substrate 20. The resonance frequency of an individual resonator is determined by its lateral dimensions and by the effective dielectric function of the medium surrounding the resonator. The filtered signal is available at the capacitively coupled output 14.

Figure 2A:
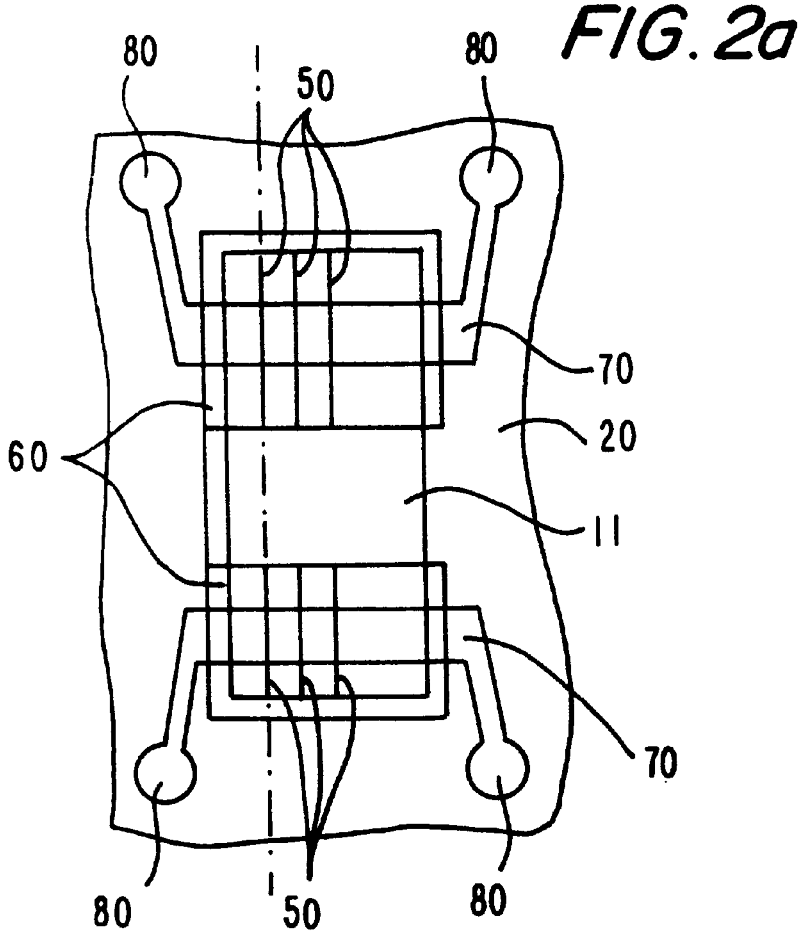
FIG. 2*a* is a top view of a resonator with a Josephson contact.

An individual resonator 11 according to the invention is illustrated on a dielectric substrate 20 in FIG. 2*a*, in which the same reference numbers as in FIG. 1 indicate the same parts or parts having the same function. A plurality of Josephson contacts 50 are arranged approximately perpendicularly to the outer edges of the resonator 11 and are shown with solid lines. In the embodiment shown in FIGS. 2*a* and 2*b* each Josephson contact 50 extends over about a third of the length of the resonator 11. A control strip 70 having contact pads 80 at its opposite ends spaced sufficiently far from the resonator 11 is arranged on the resonator 11 near the Josephson contacts 50 approximately parallel to an outer edge of the resonator 11. A thin insulating layer 60 for galvanic coupling of the resonator and the control strip is applied between the resonator 11 and the control strip 70. A dashed line in FIG. 2*a* symbolizes the section line for FIG. 2*b*.

FIG. 2*b* shows a cutaway side view of the resonator from FIG. 2*a* along the section line shown in FIG. 2*a*. Again the same reference numbers as in FIG. 2*a* indicate the same parts or parts having the same function. The resonator 11 is located on the substrate 20. The Josephson contacts 50 are arranged in the resonator 11 approximately perpendicular to Crystallographically perturbed or disturbed regions are arranged under the Josephson contacts 50 in the substrate, which, because of their form, in the illustration are called linear perturbations 90 in the substrate 20. The control strip 70 is arranged on the resonator 11 separated from them by an insulating layer 60.

When a current flows through the superconductor 70, it is surrounded by a magnetic field which is illustrated by field lines 100. In a suitably selected magnetic field the Josephson contacts 50 for the superconducting charge carriers are blocked, and the dimensions of the superconducting resonators are thus reduced. In the present example the resonator is shortened by about a factor of three, so that its eigenfrequencies are tripled. This strong detuning equally causes a switching off, when the new resonance frequency is outside of the spectrum of the input signals. A multiple or compound switch which switches between several resonance frequencies can also be provided by differently dimensioned Josephson contacts in this way.

A method which makes the above-described Josephson contacts in a cuprate, includes producing linear perturbations 90 in the substrate, for example by writing by means of a focused ion beam prior to deposition of the superconductor layer. The superconductor film growing on this substrate has a thin non-conducting wall made of strongly perturbed superconductor material, which functions as the Josephson contact. With superconductors which have a larger coherence length, also a correspondingly larger coherence length must be produced in order to obtain a Josephson contact.

Another embodiment is shown in FIG. 3 in which a resonator 11 is divided into three zones with different critical temperatures. In the embodiment shown here the resonator 11 is made from Yttrium-Barium-Cuprate. The critical temperature amounts to 90 K. (kelvin) in zone 111, 85 K. in zone 112 and 80 K. in zone 113.

FIG. 4*a* shows the cross-section through the resonator along the dashed line in FIG. 3. Again the same reference numbers indicate the same parts or parts having the same function. The Yttrium-Barium-Cuprate layer 30 on which a thin insulating layer 200 and a conductor layer 201 are applied is located on the underside of the substrate 20. The insulating layer 200 should be compatible with the superconductor and can be made, e.g., from zirconium oxide. The conductor layer 201 should be made from a non-superconducting metal. The resonator 11 of the embodiment of FIG. 3 with the three zones of different transition temperature 111, 112, 113 is located on the substrate 20. The center zones are also known as core zones and the outer zones are indicated also with the words, edge zones.

A resonator with these eigenvalues can be made in at least two ways. In a first process the disorder in the superconductor, here Yttrium-Barium-Cuprate is increased before or after microstructuring by ion bombardment of the superconductor film. Each desired transition temperature is built in by their process. Very low transition temperatures however are accompanied by high losses and are undesirable for a filter with a high Q. A second process comprises reducing materials, by which each arbitrary critical temperature can be obtained without increasing losses. A spatially limited reduction of oxygen content can be achieved, e.g., by local heating by means of a laser beam in a reducing atmosphere (usually argon or vacuum).

The resonance properties of the resonator in FIG. 3 are switchable now by changing the temperature in three steps. In operation of the filter at 77 K (the boiling point of liquid nitrogen) the entire resonator is active. In FIGS. 4*a*–4*c* conductor is shown with the reference number 201 which acts as a heater resistor. By applying a voltage t the conductor 201 a current flows through it which heats the filter. Its resonance frequency is doubled at an operating temperature increased to 89 Kelvin, since the length of the superconducting segment is halved.

When 77 Kelvin is provided as the base operating temperature, a resistance heating is sufficient. However the zones 112 and 113 must conduct normally, before the ground conductor 30 and the core zone 11 of the resonator 11 conduct normally. Thus the substrate 20 must either be sufficiently thin or sufficiently heat conducting.

Another embodiment including a heating resistor is shown in FIG. 4*b*, in which the conductor 201 is mounted on the top side of the resonator galvanically insulated by a thin insulating layer 200.

Also it would be possible to provide only zones 113 and 112 with heating in order to reduce the heat capacity of the filter as shown in FIG. 4*c*. In each case one must consider that the insulating layer 200 has sufficiently good heat conductivity and the core zone 111 does not conduct normally prior to the edge zones 112 and 113. This type of isothermalizing is already usually attained by the heat conduction through the metal layer 201.

If the basic operating temperature is higher than the lowest critical temperature built into the structure, heating is insufficient for temperature adjustment and an additional cooling must be provided. This can frequently be performed according to the Peltier Principle so that the heating resistor in the above-described figures must be replaced by two different overlapping metal layers.

Finally in an additional possible embodiment the housing for a filter is provided with a heating and/or cooling device. One example of such control is shown in FIG. 5. A planar filter element comprises a resonator 11, an output 14 and input(not shown) mounted on a substrate 20 and a ground conductor 30 located on a housing 300, which is illustrated cutaway. The simplified representation shows the housing as a simple parallelepiped in which additional structural details have been omitted for simplicity. The resonators are built in according to the design shown in FIG. 3. A Peltier heater 301 is placed in the housing, which heats or cools the entire filter and thus turns it on and off. Additional temperature control is possible and known to those skilled in the art.

The disclosure in German Patent Application 196 19 585.3-35 of May 15, 1996 is incorporated here by reference. This German Patent Application describes the invention described hereinabove and claimed in the claims appended herein in below and provides the basis for a claim of priority for the instant invention under 35 U.S.C. 119.

While the invention has been illustrated and described as embodied in a switchable planar high frequency resonator and filter, it is not intended to be limited to the details shown, since various modifications and changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed is new and is set forth in the following appended claims:

1. A planar high frequency resonator comprising a substrate having a crystalline structure including a locally perturbed region;

a superconductor microstructure mounted on the substrate, said superconductor microstructure having a geometry determinative of resonance properties of the resonator including resonance width and resonance position; and means for shifting a predetermined portion of the superconductor microstructure into a normal conducting state;

wherein said means for shifting a predetermined portion of the superconductor microstructure into a normal conducting state includes at least one Josephson contact for said predetermined portion of the superconductor microstructure displaced into the normal conducting state in the superconductor microstructure, said at least one Josephson contact is arranged approximately perpendicularly to an edge of the superconductor microstructure and said at least one Josephson contact covers said locally perturbed region.

2. The resonator as defined in claim 1, wherein the superconductor microstructure comprises a cuprate.

3. The resonator as defined in claim 1, further comprising an electrical conductor and an insulating layer separating the electrical conductor from said at least one Josephson contact, and wherein said electrical conductor is arranged so that a current flowing through said electrical conductor produces a magnetic field with a field component parallel to said at least one Josephson contact.

4. A planar high frequency resonator comprising a substrate;

a superconductor microstructure mounted on the substrate, said superconductor microstructure having a geometry determinative of resonance properties of the resonator including resonance width and resonance position; and means for shifting a predetermined portion of the superconductor microstructure into a normal conducting state;

wherein the superconductor microstructure includes at least two zones having different crystallographic disorder or different stoichiometry so as to have different critical temperatures, and further comprising means for changing a temperature of the resonator.

5. The resonator as defined in claim 4, wherein said different stoichiometry is provided by local variations in local oxygen content.

6. The resonator as defined in claim 4, wherein the superconductor microstructure comprises a cuprate.

7. A planar high frequency filter comprising at least one planar high frequency resonator, at least one input for the at least one resonator, and at least one output for the at least one resonator;

wherein said at least one planar high frequency resonator comprises a substrate having a crystalline structure including a locally perturbed region;

a superconductor microstructure mounted on the substrate, said superconductor microstructure having a geometry determinative of resonance properties of the resonator including resonance width and resonance position; and means for shifting a predetermined portion of the superconductor microstructure into a normal conducting state including at least one Josephson contact for said predetermined portion of the superconductor microstructure displaced into the normal conducting state in the superconductor microstructure, said at least one Josephson contact being arranged approximately perpendicularly to an edge of the superconductor microstructure and covering said locally perturbed region.

8. A planar high frequency filter comprising at least one planar high frequency resonator, at least one input for the at least one resonator, and at least one output for the at least one resonator;

wherein said at least one planar high frequency resonator comprises a substrate;

a superconductor microstructure mounted on the substrate, said superconductor microstructure having a geometry determinative of resonance properties of the resonator including resonance width and resonance position; and means for shifting a predetermined portion of the superconductor microstructure into a normal conducting state;

wherein the superconductor microstructure includes at least two zones having different crystallographic disorder or different stoichiometry so as to have different critical temperatures, and further comprising means for changing a temperature of the resonator.

* * * * *